United States Patent
Kashiyama

(10) Patent No.: US 8,471,436 B2
(45) Date of Patent: Jun. 25, 2013

(54) PIEZOELECTRIC ELEMENT DRIVE CIRCUIT AND FOREIGN SUBSTANCE REMOVING APPARATUS

(75) Inventor: Ritsuo Kashiyama, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 152 days.

(21) Appl. No.: 12/749,232

(22) Filed: Mar. 29, 2010

(65) Prior Publication Data
US 2010/0254004 A1 Oct. 7, 2010

(30) Foreign Application Priority Data
Apr. 1, 2009 (JP) ................................. 2009-089580

(51) Int. Cl.
*H01L 27/00* (2006.01)
(52) U.S. Cl.
USPC ........................................... 310/317; 359/307
(58) Field of Classification Search
USPC ........................................... 310/317; 359/507
See application file for complete search history.

(56) References Cited

U.S. PATENT DOCUMENTS

| | | | |
|---|---|---|---|
| 5,359,268 A * | 10/1994 | Kashiyama | 318/116 |
| 6,215,223 B1 * | 4/2001 | Furukoshi et al. | 310/316.01 |
| 6,215,224 B1 * | 4/2001 | Kataoka et al. | 310/316.02 |
| 2004/0169761 A1 | 9/2004 | Kawai et al. | |
| 2005/0081635 A1 * | 4/2005 | Kobayashi | 73/580 |
| 2005/0242283 A1 * | 11/2005 | Hasegawa et al. | 250/310 |
| 2008/0180143 A1 * | 7/2008 | Shigemori et al. | 327/156 |
| 2008/0259200 A1 * | 10/2008 | Matsumoto | 348/340 |
| 2009/0225214 A1 * | 9/2009 | Takizawa | 348/335 |

FOREIGN PATENT DOCUMENTS

| | | |
|---|---|---|
| JP | 01-227671 | 9/1989 |
| JP | 05-184169 | 7/1993 |
| JP | 2003-333391 | 11/2003 |
| JP | 2008-003165 A | 1/2008 |

OTHER PUBLICATIONS

The above reference was cited in a Feb. 15, 2013 Japanese Office Action, which is enclosed without English Translation, that issued in Japanese Patent Application No. 2009-089580.

* cited by examiner

*Primary Examiner* — Walter Benson
*Assistant Examiner* — Bryan Gordon
(74) *Attorney, Agent, or Firm* — Cowan, Liebowitz & Latman, P.C.

(57) ABSTRACT

A piezoelectric element drive circuit for outputting a signal that drives a piezoelectric element, the piezoelectric element drive circuit including: a frequency signal generation unit that outputs a frequency signal whose frequency is altered discretely; a voltage-controlled oscillator that alters the frequency of an output signal based on an inputted voltage; a phase comparator that compares the phase of the output signal from the frequency signal generation unit and the phase of the output signal of the voltage-controlled oscillator; and a loop filter that inputs, into the voltage-controlled oscillator, an output voltage that is altered based on alterations in an output signal from the phase comparator. The output signal of the voltage-controlled oscillator is the signal that drives the piezoelectric element.

2 Claims, 5 Drawing Sheets

PIEZOELECTRIC ELEMENT DRIVE CIRCUIT AND FOREIGN SUBSTANCE REMOVING APPARATUS

BACKGROUND OF THE INVENTION

1. Field of the Invention

The present invention relates to a drive circuit for an apparatus that, in an image capturing apparatus such as a digital camera, removes foreign substances adhering to the surface of an optical element disposed in front of an image sensor.

2. Description of the Related Art

Digital image capturing apparatuses as exemplified by digital still cameras, video cameras, and so on (hereinafter referred to simply as "cameras") are quickly spreading due to their immediacy, high compatibility with personal computers, and so on. Such cameras obtain image data by photoelectrically converting an object image using an image sensor, and generally, in their most basic configurations, are composed of an image sensor, an imaging optical system, and an optical element such as a low-pass filter or the like disposed in front of the image sensor.

If, with the stated camera, a foreign substance such as dust or the like adheres to the optical element, that foreign substance itself will appear in the image, causing a drop in the image quality. For this reason, various techniques for removing foreign substances that have adhered to the optical element by causing the optical element to vibrate have been proposed, and are in recent years beginning to come into practical use (see Japanese Patent Laid-Open No. 2003-333391).

Incidentally, when removing foreign substances that have adhered to the optical element by causing the optical element to vibrate as mentioned above, a vibration apparatus that employs a piezoelectric element is generally used as the apparatus to cause the optical element to vibrate. When driving this piezoelectric element, the driving frequency is changed, in a continuous manner or in steps of approximately several tens of Hz, within a predetermined frequency range from several tens of kHz to several hundred kHz.

The reason for this is that a member that elicits a high Q-value is employed in order to achieve a large vibration when vibrating the optical element by exploiting the resonance phenomenon, and it is thus necessary to drive the piezoelectric element in the vicinity of a resonance frequency. At this time, the resonance frequency fluctuates due to reasons such as changes in temperature caused by driving and the like, and thus it is necessary, in order to achieve a high resonance, to alter the driving frequency in a continuous manner or in steps of approximately several tens of Hz as described above.

When generating a driving signal as described above, a voltage-controlled oscillator (abbreviated as "VCO" hereinafter) or the like is used in order to alter the frequency in a continuous manner, creating a frequency signal that is altered in a continuous manner by altering the input voltage. However, a VCO is an oscillator that employs an analog circuit, and thus there is a problem in that the oscillation frequency fluctuates due to individual variations in components, changes in temperature, or the like.

The following methods have been proposed as solutions. One such method generates a high-frequency and highly-accurate frequency signal using an element that is capable of generating an accurate frequency, such as a crystal oscillator, a ceramic oscillator, or the like, and causes a piezoelectric element to vibrate by performing frequency division based on that signal and generating a driving signal of an accurate frequency (see Japanese Patent Laid-Open No. 5-184169). Another such method causes a piezoelectric element to vibrate by generating a driving signal of an accurate frequency using a PLL synthesizer (see Japanese Patent Laid-Open No. 1-227671).

However, with the stated method that generates an accurate frequency signal with a high frequency and performs frequency division, the stated method that uses a PLL synthesizer, and so on, it is necessary to generate a high-frequency signal to serve as a base for altering the driving frequency in steps of approximately several tens of Hz. For example, assuming that the driving frequency is approximately 200 kHz, and the frequency is to be altered in steps of approximately 50 Hz, a signal of approximately 800 MHz is necessary. The generation of such a high-frequency signal is problematic in that it increases the amount of power consumed, increases the amount of unnecessary radiation, and requires the use of circuit components capable of operating at high speeds.

SUMMARY OF THE INVENTION

Having been achieved in light of the aforementioned problems, the present invention makes it possible to generate a highly-accurate driving signal for a vibration apparatus that employs a piezoelectric element using an oscillated signal having a comparatively low frequency.

A piezoelectric element drive circuit according to the present invention is a piezoelectric element drive circuit for outputting a signal that drives a piezoelectric element, and includes: a frequency signal generation unit that outputs a frequency signal whose frequency is altered discretely; a voltage-controlled oscillator that alters the frequency of an output signal based on an inputted voltage; a phase comparator that compares the phase of the output signal from the frequency signal generation unit and the phase of the output signal of the voltage-controlled oscillator; and a loop filter that inputs, into the voltage-controlled oscillator, an output voltage that is altered based on alterations in an output signal from the phase comparator. The output signal of the voltage-controlled oscillator is the signal that drives the piezoelectric element.

Further features of the present invention will become apparent from the following description of exemplary embodiments with reference to the attached drawings.

DESCRIPTION OF THE EMBODIMENTS

A single-lens reflex digital camera serving as an image capturing apparatus provided with a vibration apparatus that uses a piezoelectric element according to an embodiment of the present invention shall hereinafter be described in detail with reference to the drawings.

Figure 1:
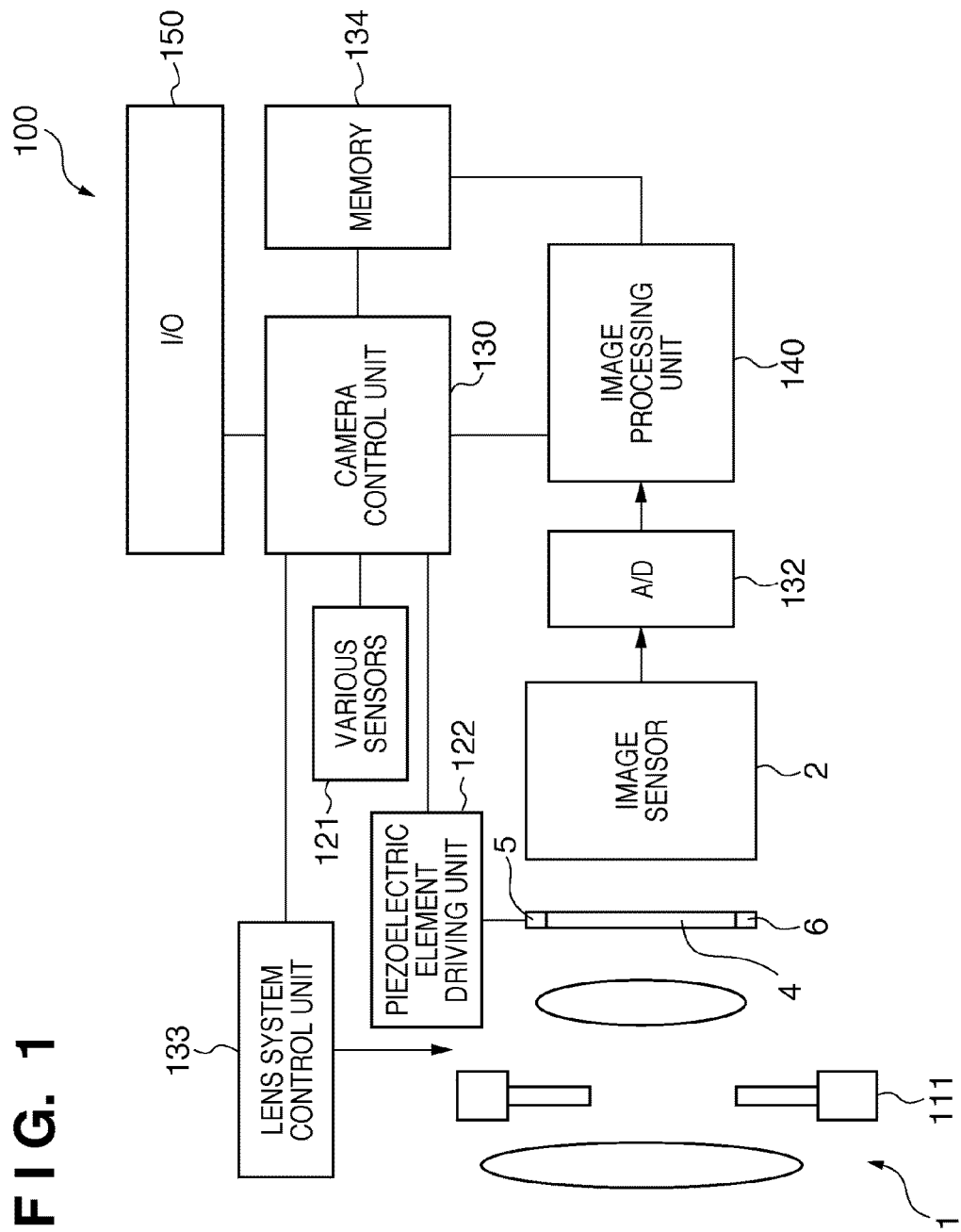
FIG. 1 is a block diagram illustrating a single-lens reflex digital camera according to a first embodiment of the present invention.

FIG. 1 is a block diagram illustrating a single-lens reflex digital camera according to an embodiment of the present invention.

In FIG. 1, 1 indicates an interchangeable imaging lens unit for forming an object image, 111 indicates an iris provided within the imaging lens unit 1 for adjusting the amount of light incident upon an image sensor 2, and 2 indicates an image sensor for photoelectrically converting the object image. An optical member 4, functioning as both a low-pass filter and a dust-resistant filter such as a cover filter, is disposed in front of the image sensor 2 in the vicinity thereof, and foreign substances adhere to the surface of this optical member 4. Foreign substances that adhere in this manner result in shadows that appear in the object image upon the image sensor 2. Piezoelectric elements 5 and 6 that remove adhering foreign substances by causing the optical member 4 to vibrate are disposed on the left and right of the optical member 4 (the top and bottom in FIG. 1, for the sake of simplicity). The piezoelectric elements 5 and 6 are connected to a piezoelectric element driving unit 122 that drives the piezoelectric elements 5 and 6 to vibrate independently from each other.

132 indicates an A/D converter that converts an analog image signal outputted from the image sensor 2 into a digital signal, and 140 indicates an image processing unit that processes the digital image signal outputted from the A/D converter. Meanwhile, 133 indicates a lens system control unit that controls the lens position, iris aperture, and so on of the imaging lens unit 1, whereas 121 indicates various sensors such as an AF (autofocus) sensor, an AE (auto exposure) sensor, and the like. Furthermore, 130 indicates a camera control unit that controls the overall operations of the digital camera, 150 indicates an I/O for a shutter button, a display, an imaging mode selection dial, and the like, and 134 indicates a memory for storing captured images, various types of information, and so on.

User operations are obtained via the I/O 150, and the power is turned on or off, imaging operations are carried out, and so on based on the user operations. When imaging operations are instructed, the camera control unit 130 determines appropriate imaging conditions based on information obtained from the various sensors 121, the image sensor 2, and so on, and the appropriate lens position and so on is set via the lens system control unit 133. After exposure, the output signal from the image sensor 2 is digitalized via the A/D converter 132; the image processing unit 140 then performs appropriate image processes on the digitalized signal, and the signal is then stored in the memory 134. Furthermore, images are displayed in the display (not shown) via the I/O 150 as necessary. The image processing unit 140 performs processes such as white balance adjustment, RGB development, compression, and so on.

Figure 2:
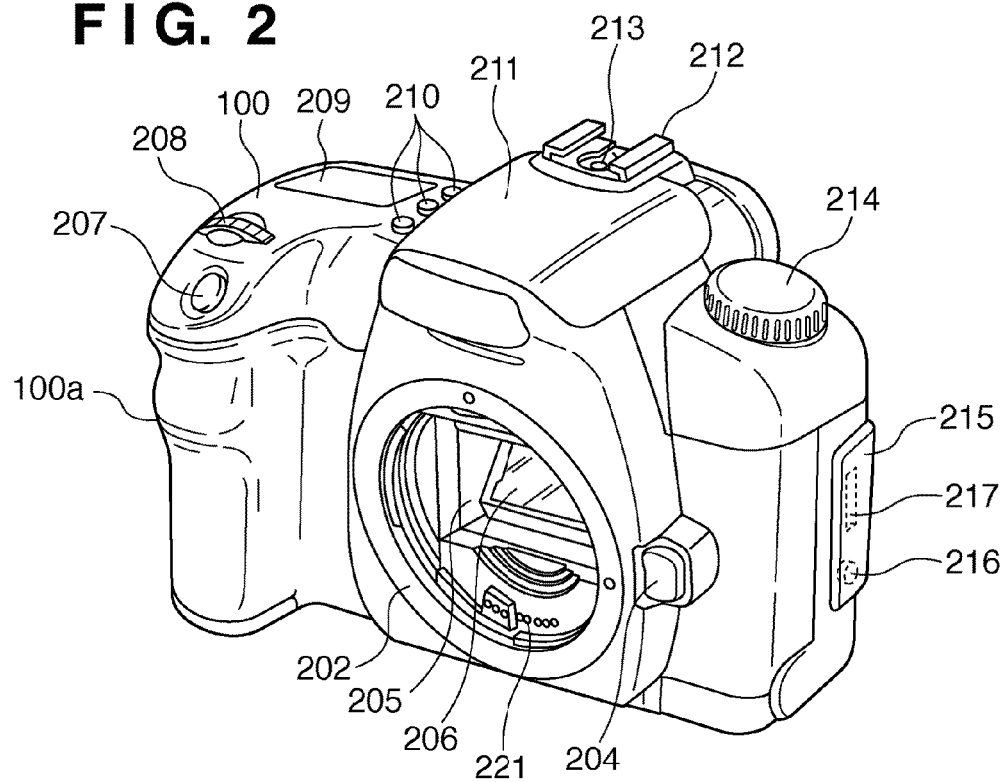
FIG. 2 is a diagram illustrating an external view of the single-lens reflex digital camera according to the first embodiment.

FIG. 2 is a diagram illustrating an external view of the single-lens reflex digital camera according to the first embodiment. To be more specific, FIG. 2 is a perspective view illustrating the front side of the camera, and illustrates a state in which the imaging lens unit is removed.

In FIG. 2, 100 indicates the camera body, and a grip portion 100a is provided protruding in the forward direction of the camera in order to enable a user to grip the camera in a stable manner during imaging. 202 indicates a mounting portion that anchors the removable imaging lens unit 1 (see FIG. 1) to the camera body 100. Mount contact points 221 function to exchange control signals, status signals, data signals, and so on between the camera body 100 and imaging lens unit 1, and also function to supply power to the imaging lens unit. The mount contact points 221 may be configured to be capable not only of electrical communications but also of optical communications, audio communications, or the like.

204 indicates a lens lock release button that is depressed when removing the imaging lens unit 1. 205 indicates a mirror box, disposed within the camera housing, and imaging light beams that have passed through the imaging lens are guided here. A quick-return mirror 206 is disposed within the mirror box 205. The quick-return mirror 206 is capable of taking on two states, or a state held at a 45° angle relative to the imaging optical axis so as to guide the imaging light beams in the direction of a pentaprism (not shown), and a state held in a position retracted from the imaging light beams so as to guide the imaging light beams to the image sensor 2 (see FIG. 1).

A shutter button 207 serving as a switch for commencing imaging, a main operational dial 208 for setting the shutter speed, lens aperture value, and so on based on the operational mode at the time of imaging, and operational mode setting buttons 210 for the imaging system are disposed in the upper portion of the camera on the side thereof where the grip is located. Some of the operational results of these operational members are displayed in an LCD display panel 209. The I/O 150 indicated in FIG. 1 is an I/O primarily for these operational members, the display panel, and so on.

The shutter button 207 is configured so as to turn a switch SW1 on at a first stroke (pressed halfway), and to turn a switch SW2 on at a second stroke (fully depressed). Meanwhile, the operational mode setting buttons 210 are used for carrying out settings such as whether a single pressing of the shutter button 207 executes continuous shots or single shots, settings for a self-imaging mode, and so on, and the status of those settings is displayed in the LCD display panel 209.

A flash unit 211 that pops up from the camera body, a shoe groove 212 for attaching a flash, and a flash contact point 213 are disposed in the upper portion of the camera in the center thereof, and an imaging mode setting dial 214 is disposed in the upper portion of the camera toward the right side thereof. Note that the imaging mode setting dial 214 also functions as an operational unit for starting operations to remove foreign substances such as dust or the like that have adhered to the surface of the optical member 4 by causing the optical member 4 to vibrate using the piezoelectric elements 5 and 6. A connection terminal cover 215 that is capable of being opened and closed is provided on the side surface on the side opposite to the grip side; a video signal output jack 216 and a USB output connector 217, serving as external interfaces, are provided underneath this connection terminal cover 215.

Figure 3:
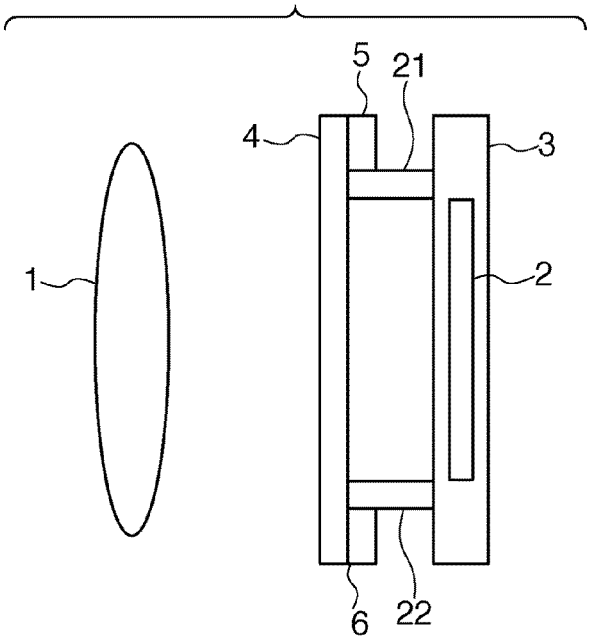
FIG. 3 is an enlarged view of the vicinity of an image sensor illustrated in FIG. 1, viewed from above.

FIG. 3 is an enlarged view of the vicinity of an image sensor illustrated in FIG. 1, viewed from above.

In FIG. 3, 1 indicates the imaging lens unit, 2 indicates the image sensor for photoelectrically converting light incident thereupon from the imaging lens unit 1, and 3 indicates an image sensor package for attaching the image sensor 2 to the camera. Meanwhile, 4 indicates the optical member, provided in front of the image sensor package 3, that functions as a dust-resistant filter for preventing foreign substances such as dust or the like from adhering to the surface of the image sensor package 3 and the image sensor 2. Note that the optical member 4 is, specifically, an optical low-pass filter, an infrared light reduction filter, and the like. Furthermore, 5 and 6 indicate the vibrating piezoelectric elements used to cause the optical member 4 to vibrate, and 21 and 22 indicate holding members for holding the optical member 4 to the image sensor package 3 in a sealed state.

Figure 4:
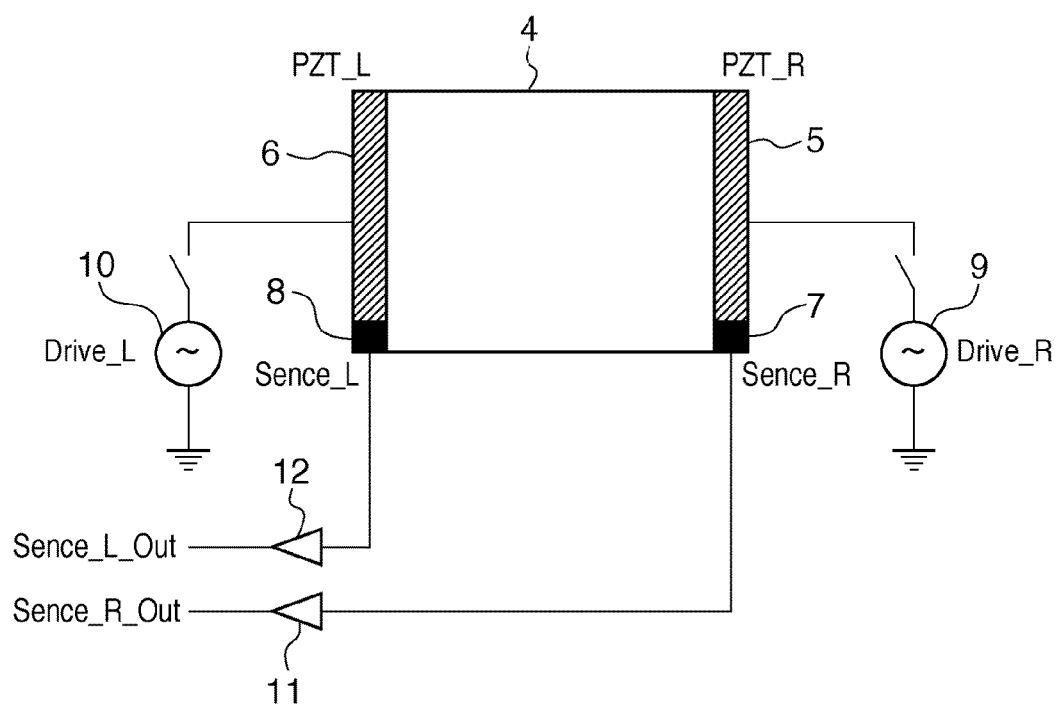
FIG. 4 is a diagram illustrating the state of an optical member portion shown in FIG. 3 viewed from the side of the image sensor and the peripheral circuitry of piezoelectric elements.

FIG. 4 is a diagram illustrating the state of the optical member 4 portion shown in FIG. 3 viewed from the side of the image sensor 2 and the peripheral circuitry of piezoelectric elements (the internal circuitry of the piezoelectric element driving unit 122 shown in FIG. 1).

In FIG. 4, the piezoelectric elements (vibrating piezoelectric elements) 5 and 6 for removing foreign substances are attached to the right and left sides, respectively, of the optical member 4, with the optical member 4 located therebetween. 7 and 8 indicate detection piezoelectric elements, disposed adjacent to the piezoelectric elements 5 and 6, respectively, that detect the vibration state of the optical member 4.

9 indicates a drive circuit for driving the piezoelectric element 5, 10 indicates a drive circuit for driving the piezoelectric element 6, 11 indicates a detection circuit for detecting a signal from the detection piezoelectric element 7, and 12 indicates a detection circuit for detecting a signal from the detection piezoelectric element 8.

The configuration is such that the piezoelectric elements 5 and 6 attached to the respective sides of the optical member 4 are caused to vibrate at a predetermined frequency, producing a standing wave in the optical member 4 and thus causing the optical member 4 to vibrate, which in turn shakes off foreign substances such as dust or the like that have adhered to the surface of the optical member 4. The amplitude of the vibration produced in the optical member 4 is detected by the detection piezoelectric elements 7 and 8.

Figure 5:
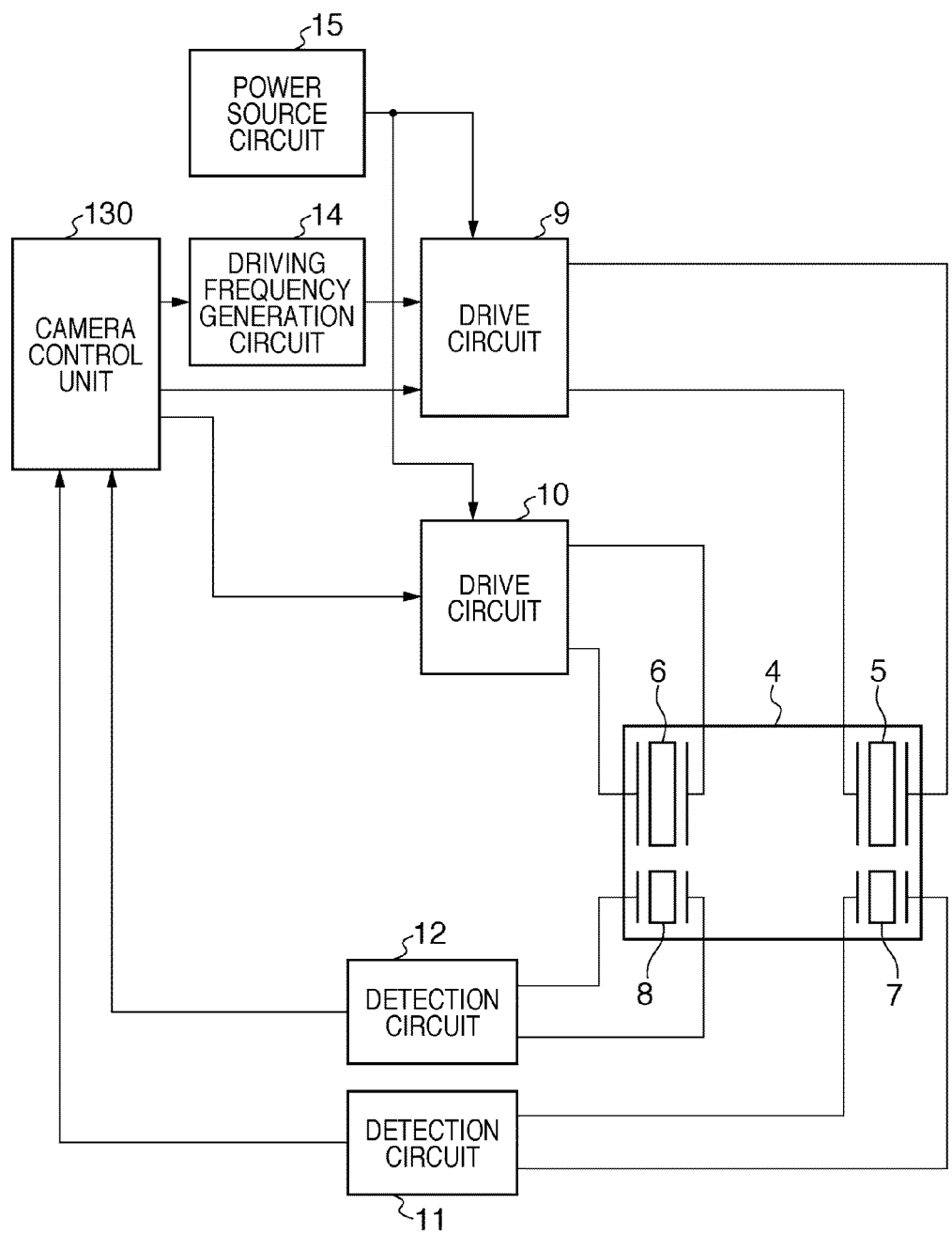
FIG. 5 is a block diagram illustrating the configuration of a control circuit that controls the piezoelectric element and a detection piezoelectric element.

FIG. 5 is a block diagram illustrating the configuration of a control circuit that controls the piezoelectric elements 5 and 6 and the detection piezoelectric elements 7 and 8; the elements 4, 5, 6, 7, 8, 9, 10, 11, and 12 are the same as those described with reference to FIG. 4.

130 indicates the camera control unit shown in FIG. 1 that controls the overall operations of the digital camera and also controls the vibration of the piezoelectric elements 5 and 6; generally, a microcomputer is used as the camera control unit 130. 14 indicates a driving frequency generation circuit that outputs a high-frequency signal for driving the piezoelectric elements 5 and 6 under the control of the camera control unit 130. The driving frequency generation circuit 14 outputs a frequency signal for applying a vibration while altering the oscillation frequency in accordance with a signal from the camera control unit 130. 15 indicates a power source circuit that supplies power for driving the piezoelectric elements 5 and 6, and is connected to the drive circuits 9 and 10.

Here, the overall operations of the driving control circuitry shown in FIGS. 4 and 5 will be described.

The camera control unit 130 outputs, to the driving frequency generation circuit 14, a signal specifying a necessary frequency for driving the piezoelectric elements 5 and 6, and the driving frequency generation circuit 14 outputs a signal of the specified frequency to the drive circuits 9 and 10. The drive circuits 9 and 10 have a function for outputting power supplied from the power source circuit 15 in accordance with signals inputted from the camera control unit 130 and the driving frequency generation circuit 14 using an H-bridge circuit. Furthermore, the camera control unit 130 is capable of controlling whether or not the outputs of the drive circuits 9 and 10 are active on an individual basis by supplying, to the drive circuits 9 and 10, a driving permission/prohibition signal that specifies whether to permit or prohibit the driving of the piezoelectric elements.

When the outputs of the drive circuits 9 and 10 are permitted by the camera control unit 130, driving signals of the frequency specified by the camera control unit 130 are applied to the piezoelectric elements 5 and 6, thereby causing optical member 4 to vibrate, which in turn produces a standing wave upon optical member 4. Note that the frequency of the signals applied to the piezoelectric elements 5 and 6 can be changed by the camera control unit 130 altering the signal sent to the driving frequency generation circuit 14, thereby altering the oscillation frequency of the driving frequency generation circuit 14. Altering the frequency in this manner makes it possible to alter the number of nodes and anti-nodes in the standing wave produced upon optical member 4, and also makes it possible to produce a standing wave of the maximum amplitude.

When a standing wave is produced upon the optical member 4, the detection piezoelectric elements 7 and 8 vibrate, generating a signal. The signal generated by the detection piezoelectric element 7 is converted by the detection circuit 11 into a signal that can be detected by the camera control unit 130, and is inputted into the A/D conversion input of the camera control unit 130. Similarly, the signal generated by the detection piezoelectric element 8 is converted by the detection circuit 12 into a signal that can be detected by the camera control unit 130, and is inputted into the A/D conversion input of the camera control unit 130.

Figure 6:
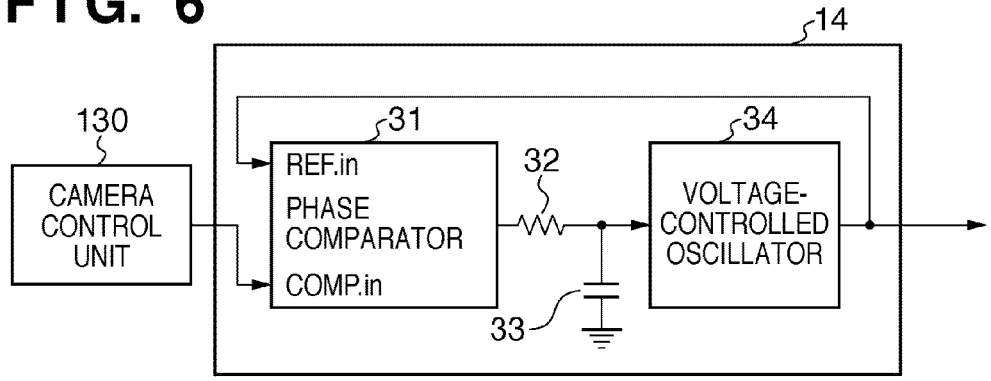
FIG. 6 is a block diagram illustrating a driving frequency generation circuit 14 shown in FIG. 5 in detail.

FIG. 6 is a diagram illustrating the driving frequency generation circuit 14 in detail.

In FIG. 6, the driving frequency generation circuit 14 is configured of a phase comparator and what is known as a PLL (phase locked loop) composed of a loop filter and a voltage-controlled oscillator. The camera control unit 130 outputs a signal of a frequency necessary for driving the piezoelectric elements while discretely changing the frequency. 31 indicates the phase comparator, into which a signal outputted from the camera control unit 130 is inputted as COMP.in and a signal corresponding to the output of the driving frequency generation circuit 14 is inputted as REF.in; the phase comparator compares the phase and frequency of these two signals and outputs a comparison result.

Here, the phase comparator is a positive edge-triggered tri-state output phase comparator as exemplified by, for example, the phase comparator provided within the PLL-IC CD74HC5046A manufactured by the U.S.-based Texas Instruments.

32 indicates a resistance that has one end connected to the output of the phase comparator 31, and 33 indicates a capacitor that is connected between the end of the resistance 32 that is not connected to the phase comparator 31 and the ground of the circuit. Along with the resistance 32, the capacitor 33 configures a loop filter for smoothing the output of the phase comparator 31. 34 indicates a voltage-controlled oscillator that is inputted with a signal (output voltage) that has been outputted from the phase comparator 31 and has passed through the loop filter configured of the resistance 32 and the capacitor 33, and serves to alter the output frequency in accordance with an inputted voltage.

Figure 7:
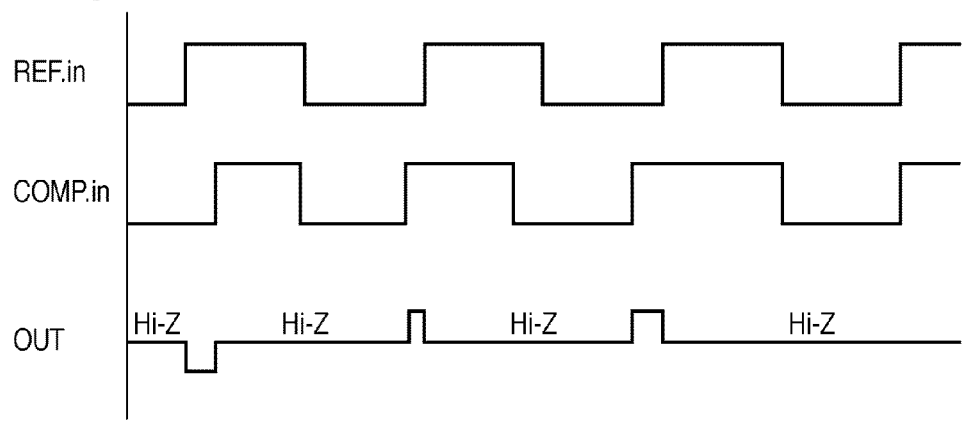
FIG. 7 is a diagram illustrating an input/output relationship of a phase comparator 31.

FIG. 7 is a diagram illustrating operations of the phase comparator 31. FIG. 7 illustrates a relationship between the two input signals, or REF.in and COMP.in, and the output signal, and illustrates alteration of the output based on the input timing at which the two input signals rise.

When the rise of COMP.in is later than the rise of REF.in, Low is outputted from when REF.in rises to when COMP.in rises. Meanwhile, when the rise of COMP.in is sooner than the rise of REF.in, High is outputted from when COMP.in rises to when REF.in rises. A Hi-Z state is maintained at all other times.

For this reason, the electrical load of the capacitor 33 is discharged via the resistance 32 while Low is being outputted, and because the voltage inputted to the voltage-controlled oscillator 34 drops, the output frequency of the voltage-controlled oscillator 34 drops as well. Meanwhile, an electrical load is accumulated in the capacitor 33 via the resistance 32 while High is being outputted, and because the voltage inputted to the voltage-controlled oscillator 34 rises, the output frequency of the voltage-controlled oscillator 34 rises as well. Furthermore, the electrical load of the capacitor 33 does not change when the output is Hi-Z, and thus the voltage inputted into the voltage-controlled oscillator 34 does not change, and the output frequency of the voltage-controlled oscillator 34 is not altered.

Figure 8:
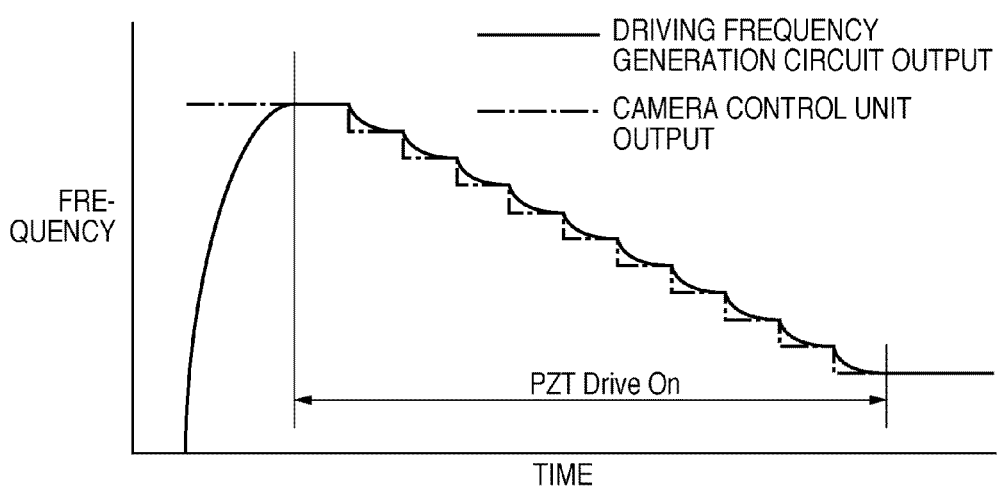
FIG. 8 is a diagram illustrating a relationship between the output frequency of a camera control unit and the output frequency of a driving frequency generation circuit.

FIG. 8 is a diagram illustrating a relationship between the input and the output of the driving frequency generation circuit 14 according to the present embodiment, and here, the input signal corresponds to the output of the camera control unit 130.

First, of the frequencies within a predetermined frequency range necessary for driving the piezoelectric elements 5 and 6, the camera control unit 130 (frequency signal generation unit) outputs the highest frequency, and waits for a predetermined amount of time to elapse. This "predetermined amount of time" is an amount of time for allowing the input frequency and the output frequency of the driving frequency generation circuit 14 to become approximately equal. After the predetermined amount of time has elapsed, the camera control unit outputs a signal for driving the piezoelectric elements 5 and 6, thus commencing the driving of those piezoelectric elements.

After commencing the driving of the piezoelectric elements 5 and 6, the camera control unit 130 alters the outputted frequency in stepwise form, outputting a lower frequency after each predetermined amount of time has elapsed, as indicated by the dot-dash line shown in FIG. 8, thereby altering the frequency for driving the piezoelectric elements 5 and 6. In the driving frequency generation circuit 14, the frequency inputted to the phase comparator 31 gradually comes to differ from the output frequency in accordance with the stated alteration to the input frequency. For this reason, the phase comparator 31 outputs Low at each rising edge of the input signals, thereby gradually reducing the output frequency until the input frequency and the output frequency are the same frequency, as indicated by the solid line in FIG. 8. Here, the degree of alteration of the output frequency of the driving frequency generation circuit 14 is determined in accordance with a time constant based on values from the resistance 32 and the capacitor 33, and the output frequency is more gradually altered the greater the time constant is.

In this manner, the camera control unit 130 (frequency signal generation unit) alters the frequency signal necessary for driving the piezoelectric elements 5 and 6 discretely (in stepwise form) in accordance with a time constant internal to the driving signal generation circuit 14. Accordingly, it is possible to output a signal of a frequency that is altered in a continuous manner between the pre- and post-change frequencies outputted by the camera control unit 130.

As described thus far, in the present embodiment, a signal in which the frequency from the camera control unit 130 is sequentially altered in a discrete manner (in a stepwise form) is outputted. This signal is inputted into a PLL phase comparator, and the output of the phase comparator is inputted into the voltage-controlled oscillator 34 after passing through a loop filter configured of the resistance 32 and the capacitor 33, the loop filter having a time constant based on the necessary frequency alteration time and alteration amount. Through this, the frequency alteration performed by the camera control unit 130, which is a discrete alteration, can be changed into a continuous alteration, and a signal of an accurate driving frequency can be obtained.

While the present invention has been described with reference to an exemplary embodiment, it is to be understood that the invention is not limited to the disclosed exemplary embodiment. The scope of the following claims is to be accorded the broadest interpretation so as to encompass all such modifications and equivalent structures and functions.

This application claims the benefit of Japanese Patent Application No. 2009-089580, filed Apr. 1, 2009, which is hereby incorporated by reference herein in its entirety.

What is claimed is:

1. A piezoelectric element drive circuit for outputting a signal that drives a piezoelectric element, the drive circuit comprising:
   a frequency signal generation unit that outputs a frequency signal whose frequency is altered discretely;
   a voltage-controlled oscillator that alters the frequency of an output signal based on an inputted voltage;
   a phase comparator that compares the phase of the output signal from the frequency signal generation unit and the phase of the output signal of the voltage-controlled oscillator;
   a resistance that is connected between the voltage-controlled oscillator and the phase comparator; and
   a capacitor that is connected between the end of the resistance that is not connected to the phase comparator and a ground portion of the circuit,
   wherein degree of alteration of the frequency signal is determined in accordance with a time constant based on values from the resistance and the capacitor,
   wherein the output signal of the voltage-controlled oscillator is input into the phase comparator directly,
   wherein the voltage-controlled oscillator outputs a frequency signal whose frequency is altered continuously, and
   wherein the output signal of the voltage-controlled oscillator is the signal that is directly utilized for a driving frequency signal of the piezoelectric element.

2. A foreign substance removing apparatus comprising the piezoelectric element drive circuit according to claim 1.

* * * * *